(12) United States Patent
Glovatsky

(10) Patent No.: US 6,916,994 B2
(45) Date of Patent: Jul. 12, 2005

(54) CONFORMAL SEALING FILM

(75) Inventor: Andrew Zachary Glovatsky, Plymouth, MI (US)

(73) Assignee: Visteon Global Technologies, Inc., Van Buren Township, MI (US)

(*) Notice: Subject to any disclaimer, the term of this patent is extended or adjusted under 35 U.S.C. 154(b) by 8 days.

(21) Appl. No.: 10/437,747

(22) Filed: May 14, 2003

(65) Prior Publication Data

US 2004/0226739 A1 Nov. 18, 2004

(51) Int. Cl.[7] ............................................. H05K 1/00
(52) U.S. Cl. ..................... 174/254; 174/117 F; 174/260
(58) Field of Search ............................. 174/268, 254, 174/261, 256, 257, 258, 72 A, 72 AR, 77 R, 117 F, 117 A; 361/749, 775

(56) References Cited

U.S. PATENT DOCUMENTS

| | | | | |
|---|---|---|---|---|
| 4,381,420 A | * | 4/1983 | Elliott et al. .................. | 174/34 |
| 4,392,898 A | | 7/1983 | Pithouse et al. | |
| 4,642,421 A | | 2/1987 | Dery et al. | |
| 4,698,457 A | | 10/1987 | Bordbar | |
| 4,798,918 A | * | 1/1989 | Kabadi et al. ................. | 174/36 |
| 4,931,598 A | | 6/1990 | Calhoun et al. | |
| 4,971,574 A | | 11/1990 | Garcia | |
| 5,003,126 A | * | 3/1991 | Fujii et al. ..................... | 174/36 |
| 5,008,490 A | | 4/1991 | Strauss et al. | |
| 5,407,865 A | * | 4/1995 | Glovatsky et al. ............ | 29/841 |
| 5,427,643 A | | 6/1995 | Aitken et al. | |
| 5,461,545 A | * | 10/1995 | Leroy et al. ................. | 361/765 |
| 5,639,989 A | * | 6/1997 | Higgins, III ........... | 174/35 MS |
| 5,689,878 A | | 11/1997 | Dahringer et al. | |
| 6,127,038 A | * | 10/2000 | McCullough et al. ....... | 428/416 |
| 6,384,339 B1 | | 5/2002 | Neuman | |
| 6,753,477 B1 | | 6/2004 | Sinkunas et al. | |

FOREIGN PATENT DOCUMENTS

| | | |
|---|---|---|
| FR | 1443943 | 7/1966 |
| FR | 2058670 | 5/1971 |
| FR | 2468235 | 4/1981 |
| GB | 1104098 | 2/1968 |
| GB | 1604676 | 12/1981 |
| JP | 7141924 | 6/1995 |

* cited by examiner

Primary Examiner—Kamand Cuneo
Assistant Examiner—Ishwar (I. B.) Patel
(74) Attorney, Agent, or Firm—Brinks, Hofer, Gilson & Lione

(57) ABSTRACT

Flatwire assembly having a number of conductive elements or traces position on the substrate of the flatwire. In order to protect the conductive element from environmental hazards such as moisture and chemicals, a sealing film is provided that encapsulates the conductive elements. The sealing film has a polymer layer and an adhesive layer. The polymer layer prevents vertical diffusion of moisture into the conductive elements and the adhesive layer prevents later diffusion of moisture. The sealing film is larger than the conductive elements such that it completely encapsulates the conductive elements.

19 Claims, 3 Drawing Sheets

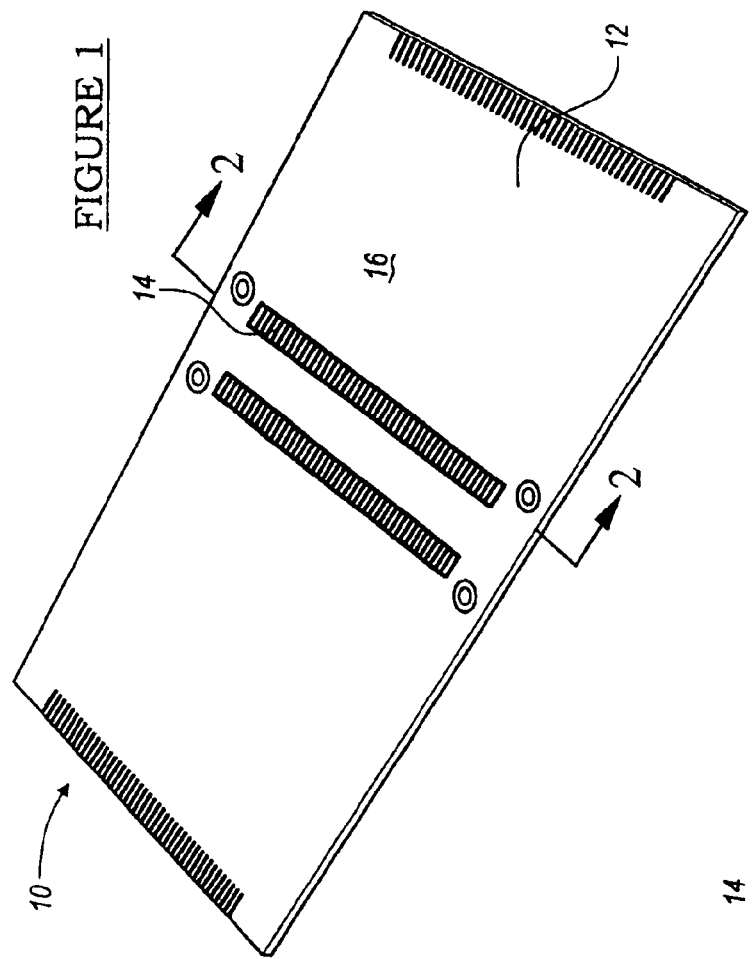
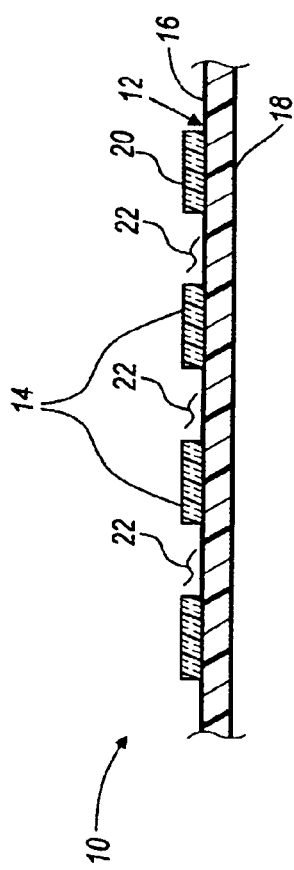

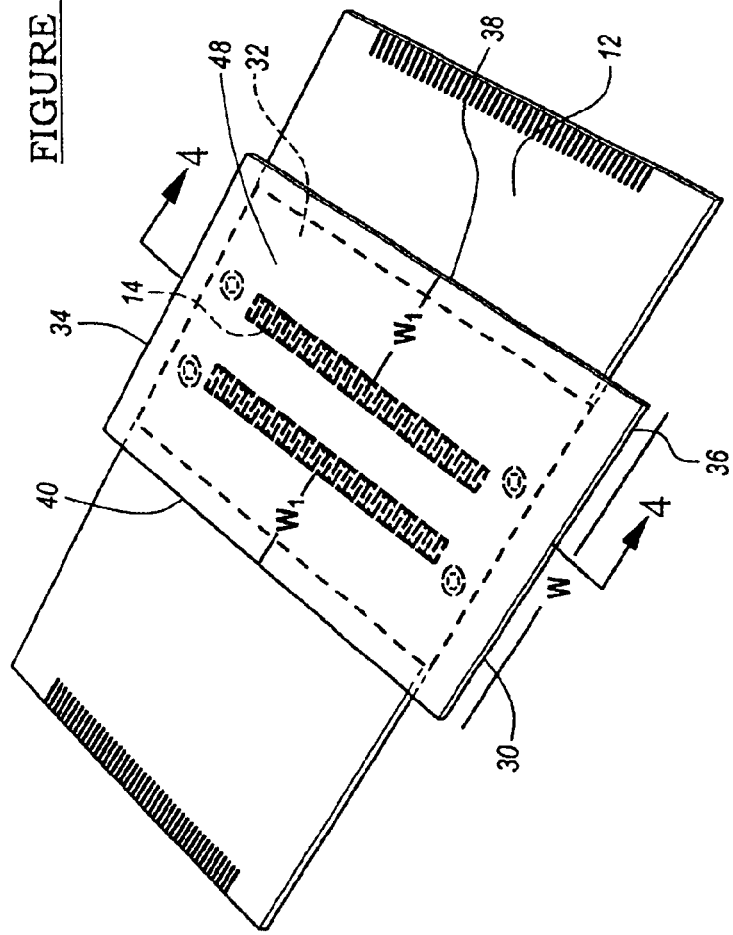
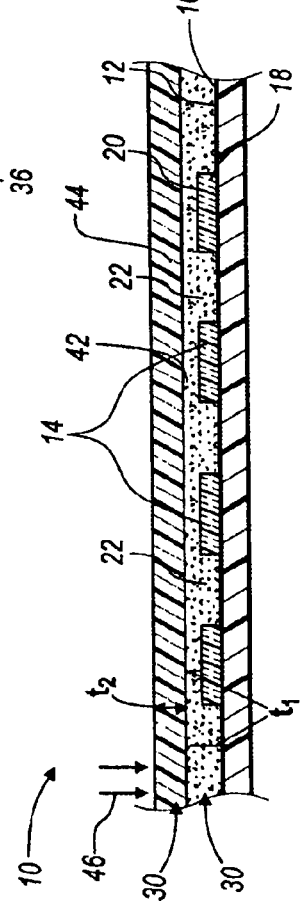

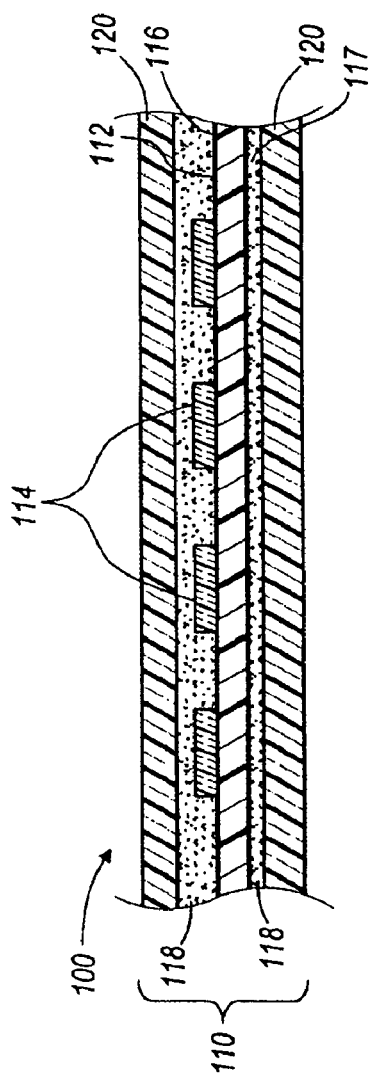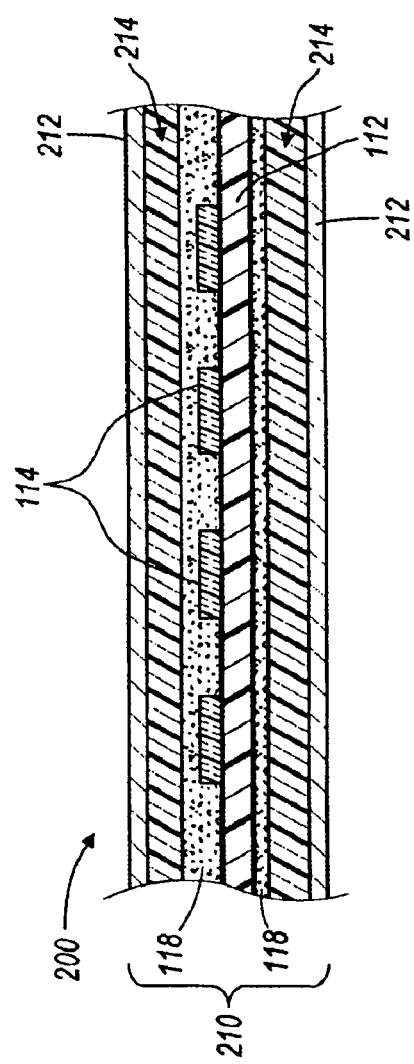

CONFORMAL SEALING FILM

TECHNICAL FIELD

The present invention relates generally to a sealing film on exposed conductive elements in a flatwire assembly.

BACKGROUND

Typical wiring, including flatwire or other flexible cable, defines one or more conductive elements which are sheathed in a protective layer of coating to seal the conductive elements from the environment. These flatwire or flexible cable can have exposed conductors and these areas may need to be protected by a coating based on where they are applied. Typically, the coating is a dielectric material which is sprayed onto the element to protect it from moisture, fungus, dust, corrosion, abrasion and other mechanical or environmental stresses. Common coatings include silicone, acrylic, urethane, polyurethane, epoxy or Parylene.

Unfortunately, the typical process of spraying a conformal coating and allowing the material to cure is costly and time consuming. Further, this form of conformal coating does not provide the breadth of protection afforded that is required to protect the components. Accordingly, there exists a need to provide a sealing film that will completely seal the component from any exposure of the electrical device or wire to the environment.

SUMMARY OF THE INVENTION

The present invention provides a conformal sealing film on an electronic component of a flatwire assembly. Generally, the flatwire assembly comprises a substrate, a plurality of conductive elements and a sealing film on top of the conductive element.

In yet another aspect, the substrate is preferably constructed of a flexible polymer, and the plurality of conductive elements is positioned on and extend along the substrate. In yet another aspect of the invention, the sealing film comprises an adhesive layers and at least one polymer layer. In yet another aspect of the present invention, the sealing film comprises an adhesive layer, at least one polymer layer and a metallic layer. The adhesive layer is such that it is compatible with both the substrate and the polymer layer.

In yet another aspect of the present invention the sealing film on the exposed conductor extends beyond the conductor such that the sealing film is partially disposed on the substrate.

In yet another aspect of the present invention the adhesive layer prevents lateral diffusion of the moisture to the conductive elements. In another aspect of the invention, the polymer layer prevents vertical diffusion of the moisture to the conductive elements. In yet another aspect of the invention the sealing film is applied to both the top and bottom side of the substrate.

BRIEF DESCRIPTION OF THE DRAWINGS

The accompanying drawings incorporated in and forming a part of the specification illustrate several aspects of the present invention, and together with the description serve to explain the principles of the invention. In the drawings:

FIG. 1 depicts a top view of a flatwire having an exposed conductor in accordance with the teachings of the present invention;

FIG. 2 is a cross-sectional view taken about the line 2—2 in FIG. 1;

FIG. 3 depicts a top view of a flatwire having the sealing film on the exposed conductor in accordance with the teachings of the present invention;

FIG. 4 is a cross sectional view taken along lines 4—4 in FIG. 3;

FIG. 5 is a cross-sectional view of an alternate embodiment of the flatwire wherein the sealing film is applied to both the top and bottom surface of flatwire substrate in accordance with the teachings of the present invention; and FIG. 6 is a cross-sectional view of yet another alternate embodiment of the flatwire wherein the sealing film has a metallic layer on the polymer layer in accordance with the teachings of the present invention.

DETAILED DESCRIPTION

Referring in particular to FIG. 1, a flatwire assembly is generally shown and represented by reference numeral 10. The flatwire assembly typically extends between various electronic sites having appropriate components for controlling or forming a system. In a vehicle, such systems include an HVAC system, a navigation system, or a radio. In this application, flatwire, flatwire circuit, and flatwire bus are used interchangeably and refer generally to flat flexible cable, also known as ribbon cable and printed flex cable.

With reference to FIGS. 1 and 2, the flatwire assembly 10 comprises a substrate 12 and a plurality of conductive elements or components or traces 14 positioned on and extending along a top surface 16 of the substrate 12. The conductive elements 14 define a first surface 18 that is attached to the top surface 16 of the substrate and a second surface 20 exposed to the environment. As shown in FIG. 2, the conductive elements 14 are arranged side by side on the surface 16 of the substrate 12 such that they define a gap 22 between them. In one aspect of the invention, the gap 22 between the conductive elements 14 is about 0.004 inch deep by about 0.010 inch wide. As will be explained later, any sealing film must be flexible enough to fill the gaps 22 between the conductive elements 14.

Although in this application and the drawings, conductive elements 14 are shown to be positioned on the top surface 16 of the substrate, it must be understood that the scope of the invention extends to flatwire assembly where the conductive elements are positioned on surface, opposite the top surface 16. Any reference to top surface 16 is only for reference purpose and is not intended to limit this application. The conductive elements 14 are attached to the top surface 16 either by an adhesive or alternatively captured by extrusion of the substrate 12. The conductive elements can also be directly deposited on the surface of the substrate.

The substrate 12 is a flexible material and formed of a polymer material, which is typically of the polyester family. Such polyester materials may include PET, PEN or polyurethane or PVC. The conductive elements 14 are typically plated or coated with plated or immersion tin, immersion silver, organic solder protectorant, HASL solder, gold.

Referring in particular to FIG. 3, since the flatwire assembly 10 is used in a number of components in a motor vehicle, the flatwire assembly 10 is exposed to a variety of moisture and chemicals. In such circumstances exposure to moisture will result in reduced performance of the flatwire assembly 10 and more particularly corrosion of the conductive elements 14. Therefore, to protect the conductive elements 14 from environmental hazards, the flatwire assembly 10 comprises a sealing film 30 disposed on second surface 20 of the conductor elements 14. As will be explained below a sealing film 30 serves to seal the conductive elements 14 and protect the conductive elements 14 from environmental hazards and chemicals.

Referring in particular to FIGS. 3 and 4, the sealing film 30 is generally defined by a vertical strip 32 disposed on top of second surface 20 the conductive elements 14. The vertical strip 32 generally extends from a top edge 34 to a bottom edge 36. The vertical strip 32 also defines a first side edge 38 and a second side edge 40. Accordingly, the top edge 34 and the bottom edge 36, connected by the first and second side edges 38, 40, generally define a rectangular shape of the vertical strip 32, although any other shape can be utilized.

Referring in particular to FIG. 4, the sealing film 30 comprises an adhesive layer 42 and at least one polymer layer 44. The adhesive layer 42 is disposed on the second surface 20 of the conductive elements 14 and also extends between the gaps 22 such that in those areas the adhesive layer 42 is disposed over the substrate 12. As mentioned above, since the conductive elements 14 are coated with a metal, the adhesive layer 42 must be compatible with the metallization. Additionally, the adhesive layer 42 must also be compatible with the material used to form the substrate 12. The adhesive used to form the adhesive layer in the present invention are silicone or acrylic based adhesives. Additionally, polyester or an epoxy based adhesives may also be used.

As shown in FIG. 4, the adhesive layer 42 not only bonds the polymer layer 44 to the conductive elements 14 but also serves to completely encapsulate the conductive elements 14. Therefore, the adhesive layer 42 should have high tack and low modulus to fill the gaps 22 between the conductive elements 14. The thickness of the adhesive layer 42 is in the range of about 0.001 inch to about 0.02 inch. In this application thickness of the adhesive layer 42 is measured from the second surface 20 of the conductive elements 14 or substrate 12 to the polymer layer 44. In order to further clarify the term thickness of the adhesive layer 42, $T_1$ represents the thickness of the adhesive layer 42. The thickness of the adhesive layer 42 depends on where the flatwire assembly is positioned in the motor vehicle.

As mentioned above, the sealing film 30 also comprises at least one polymer layer 44. The polymer layer 44 is disposed on the adhesive layer 42 and serves to further protect the conductive elements 14 from environmental hazards. The polymer layer 44 serves to prevent vertical diffusion of moisture into the conductive elements, as shown by arrows 46. In order for the polymer layer 44 to be resistant to moisture, the polymer layer is formed from materials such as PET, polyethylene napthalate (PEN), high density polyethylene (HDPE), low density polyethylene, Poly vinyl chloride (PVC) and polyurethane. It is also possible to use any other polymer system that is resistant to moisture. The polymer layer 44 in addition to being moisture resistant should also have a low modulus such that it can contour the underlying conductive elements 14 and substrate 12. The thickness of the polymer layer is in the range of about 0.001 inch to about 0.4 inch thick. The thickness of the polymer layer 44 is shown in FIG. 4 and represented as $T_2$.

The adhesive layer 42 can be applied around the periphery of the polymer layer 44 or across the entire surface of the polymer layer 44 (as shown in FIG. 4). The application of the adhesive layer 42 across the entire surface of the polymer layer 44 eliminates air from the conductive elements 14. This also prevents moisture droplets from forming on the conductive elements 14 due to condensation or exposure of the flatwire assembly 10 to liquid or moisture. The method of applying the sealing film 30 to the flatwire assembly 10 is disclosed in co-assigned application Ser. No. 10/292,565, incorporated herein by reference.

Referring in particular to FIG. 3, the vertical strip 32 defining the sealing film 30 is applied over the conductive elements 14 such that the width, shown by reference W as measured from the first side edge 38 to second side edge 40 is larger than the conductive elements 14 such that a portion 48 of the vertical strip 32 is disposed on the top surface 16 of the substrate 12. The width (W) of the vertical strip 32 is such that it will provide a long diffusion length for the moisture and other chemical, thereby protecting the conductive elements 14. In one aspect of the invention, the width (W) of the vertical strip 32 is in the range of about 5 mm to about 25 mm. The width as measured from the conductive element to the environment ($W_1$) is about 10 mm.

As shown in FIG. 3, the size of the vertical strip 32 is such that it extends beyond the edges of the substrate 12. This allows for the conductive elements 14 to be completely encapsulated with the sealing film 30. In the present invention, moisture is substantially prevented from diffusing to the conductive elements 14 by both the adhesive layer 42 and the polymer layer 44. The adhesive layer 42 prevents the lateral diffusion of moisture and the polymer layer 44 prevents the vertical diffusion of the moisture. The sealing film 30 also provides mechanical wear and puncture resistance to the conductive elements 14.

Turning now to FIG. 5, another embodiment of the invention is depicted in cross-section. As illustrated, the sealing film 110 is attached on both of the opposing surfaces of the substrate 112. As in the prior embodiment, the conductive elements 114 are attached to a top surface 116 of the substrate 112. Like the previous embodiment, the sealing film 110 comprises an adhesive layer 118 and at least one polymer layer 120. One of the adhesive layers 118 is disposed on the conductive elements 114 and the other on the opposing surface 117 of the substrate 112. Except for the sealing film 110 being disposed on opposing surfaces 116 and 117 of the substrate 112, the flatwire assembly 100, is identical to the flatwire assembly 10 described in the prior embodiment. The conductive components 114 are sealed to the environment in the same way as previously described. Therefore, it can be seen that a multi-layer flatwire assembly 100 can be formed utilizing multilayer sealing film 110 in accordance with the teachings of the present invention.

Another embodiment of the invention is shown in FIG. 6. In this embodiment, the sealing film 210 on the flatwire assembly 200 comprises an additional metallic layer 212 on the polymer layer 214. The metal used to form the metallic layer may be copper coated with tin to prevent corrosion of the metallic layer. Other metals such as aluminum may also used to form the metallic layer 212. The polymer layer 214 can be coated with a metal film through know process. Such process may include sputtering, lamination, bonding, plating or thermal spraying the metal on top of the polymer layer. The thickness of the metallic layer 212 is about 0.0014 inch and it the presence of the metallic layer 212 improves the diffusion resistance of the sealing film 200 to moisture and other chemicals.

Various variations of the invention are possible, for example it may be possible to have conductive elements on both side of the substrate. Although not shown in the drawings, the sealing film can also be used in flatwire assembly that have conductive elements embedded within the substrate. It may also be possible to have a sealing film that has more than one polymer layer. The different polymer layers capable of providing different barriers to moisture and other chemicals. Although it has not been explained in detail, the sealing film of the present invention can also be used to seal any repair/upgraded sites on the flatwire assembly.

The foregoing description of various embodiments of the invention has been presented for purposes of illustration and description. It is not intended to be exhaustive or to limit the invention to the precise embodiments disclosed. Numerous modifications or variations are possible in light of the above teachings. The embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A flatwire assembly for use in a motor vehicle, the assembly comprising:

a substrate constructed of a flexible polymer, a plurality of encapsulated conductive elements positioned on and extending along the substrate, a section of the plurality of elements being exposed;

a sealing film for patching the exposed section positioned on the plurality of conductive elements, wherein the size of the sealing film is larger than the exposed section of the plurality of conductive elements such that the exposed section of the plurality of conductive elements are encapsulated in the sealing film and a portion of the sealing film is disposed on the substrate; and the sealing film includes at least one polymer layer and an adhesive layer positioned between the plurality of conductive elements and the polymer layer.

2. The assembly of claim 1, wherein the sealing film further comprises a metallic layer disposed on top of the polymer layer.

3. The assembly of claim 2, wherein the metallic layer s copper or aluminum.

4. The assembly of claim 1, wherein the adhesive layer has high tack and low modulus to encapsulate the conductive elements.

5. The assembly of claim 4, wherein the adhesive layer is selected from a group of silicone, acrylic, polyester, epoxy based adhesive or polyurethane.

6. The assembly of claim 1, wherein the thickness of the adhesive layer is about 0.001 inch to about 0.02 inch.

7. The assembly of claim 1, wherein the polymer layer is formed of moisture resistant polymers.

8. The assembly of claim 1, wherein the thickness of the polymer layer is about 0.001 inch to about 0.4 inch.

9. The assembly of claim 1, wherein the polymer layer prevents vertical diffusion of moisture and chemicals to the plurality of conductive elements and the adhesive layer prevents vertical diffusion of moisture and chemicals to the plurality of conductive elements.

10. The assembly of claim 1, wherein the sealing film extends vertically from a top edge to a bottom edge such that it extends beyond edges of the substrate to encapsulate the edges of the substrate.

11. The assembly of claim 1, wherein a width of the sealing film is in the range of about 5 mm to about 25 mm.

12. The assembly of claim 1, wherein a width of the sealing film extending over portion of the substrate is about 5 mm.

13. A sealing film assembly for encapsulating a repaired or upgraded site on an existing flatwire assembly comprising a flatwire assembly having an exposed conductive element, the conductive element positioned on a substrate of a flatwire assembly in a motor vehicle;

at least one polymer layer;

an adhesive layer between a top surface of the conductive element and the at least one polymer layer; and wherein the adhesive layer extends beyond the exposed conductive element a sufficient distance to prevent the lateral diffusion of moisture to the conductive element.

14. The film of claim 13, further comprising a metallic layer disposed on top of the at least one polymer layer.

15. The film of claim 14, wherein the metallic layer is copper or aluminum.

16. The film of claim 13, wherein the adhesive layer has high tack and low modulus to encapsulate the at least one conductive element.

17. The film of claim 13, wherein the adhesive layer is selected from a group of silicone, acrylic, polyester, epoxy based adhesive or polyurethane.

18. The film of claim 13, wherein the thickness of the adhesive layer is about 0.001 inch to about 0.02 inch.

19. The film of claim 13, wherein the thickness of the polymer layer is about 0.001 inch to about 0.4 inch.

* * * * *

UNITED STATES PATENT AND TRADEMARK OFFICE
CERTIFICATE OF CORRECTION

PATENT NO.    : 6,916,994 B2
DATED         : July 12, 2005
INVENTOR(S)   : Andrew Z. Glovatsky It is certified that error appears in the above-identified patent and that said Letters Patent is hereby corrected as shown below:

Column 5,
Line 19, after "flexible polymer" delete "," (comma) and substitute -- ; -- semicolon.
Line 37, after "metallic layer" delete "s" and substitute -- is --.

Column 6,
Line 17, after "extending over" insert -- a --.

Signed and Sealed this

Second Day of May, 2006

JON W. DUDAS
*Director of the United States Patent and Trademark Office*